United States Patent
Wang et al.

(10) Patent No.: US 8,981,643 B2
(45) Date of Patent: Mar. 17, 2015

(54) ELECTROLUMINESCENT DISPLAY PANEL

(71) Applicant: AU Optronics Corp., Hsin-Chu (TW)

(72) Inventors: Chun-Jan Wang, Hsin-Chu (TW);
Chuan-Hsiu Chang, Hsin-Chu (TW);
Chih-Jen Yang, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/086,984

(22) Filed: Nov. 22, 2013

(65) Prior Publication Data

US 2014/0152174 A1 Jun. 5, 2014

(30) Foreign Application Priority Data

Dec. 3, 2012 (TW) .............................. 101145359 A

(51) Int. Cl.
*H01J 1/62* (2006.01)
*H01L 51/52* (2006.01)

(52) U.S. Cl.
CPC .................................. *H01L 51/5253* (2013.01)
USPC ........................................... 313/511; 313/512

(58) Field of Classification Search
USPC ...................................................... 313/498–512
See application file for complete search history.

(56) References Cited

U.S. PATENT DOCUMENTS

2005/0258745 A1* 11/2005 Tsujimura et al. ............ 313/506

\* cited by examiner

*Primary Examiner* — Anne Hines
(74) *Attorney, Agent, or Firm* — Winston Hsu; Scott Margo

(57) ABSTRACT

An electroluminescent (EL) display panel includes a substrate, an EL display array, at least one first thin film encapsulation (TFE) layer and a first patterned stress releasing layer. The EL display array is disposed on the substrate. The first TFE layer covers the EL display array. The first patterned stress releasing layer covers the first TFE layer.

12 Claims, 8 Drawing Sheets

ELECTROLUMINESCENT DISPLAY PANEL

BACKGROUND OF THE INVENTION

1. Field of the Invention

The present disclosure relates to an electroluminescent display panel, and more particularly, to the electroluminescent display panel with a patterned stress releasing layer.

2. Description of the Prior Art

Electroluminescent display panels utilize electroluminescent devices, such as organic light-emitting diode devices, to serve as display devices. Since the electroluminescent devices are sensitive to oxygen and moisture, thin film encapsulations with high moisture and oxygen barrier property are necessary to protect the electroluminescent devices. In order to be isolated from oxygen and moisture, a substrate with the electroluminescent devices and a cover glass are combined with sealant. However, the cover glass not only increases the overall thickness of the electroluminescent display panels but also belongs to a hard substrate, so it is not a choice for a flexible electroluminescent display panel.

Except a cover glass, a multiple-layered thin film encapsulation of several different materials, such as a multiple-layered thin film encapsulation formed of inorganic thin film encapsulations and organic thin film encapsulations, is applied to the flexible electroluminescent display panel to improve moisture and oxygen barrier property. Nevertheless, the stress of the inorganic thin film encapsulations is greater, thereby resulting in crack or peeling issues. Because the refractive index of the inorganic thin film encapsulations is different from that of the organic thin film encapsulations in one multiple-layered thin film encapsulation, optical interference easily occurs and the visual performance of the electroluminescent display panels is thus inferior to expectation.

SUMMARY OF THE INVENTION

It is one of the objectives of the disclosure to provide an electroluminescent display panel so as to solve problems, such as cracking, peeling off and optical interference of thin film encapsulation in the conventional electroluminescent display panel.

An embodiment of the disclosure provides an electroluminescent display panel. The electroluminescent display panel includes a substrate, an electroluminescent display array, at least one first thin film encapsulation layer and a first patterned stress releasing layer. The electroluminescent display array is disposed on the substrate. The first thin film encapsulation layer covers the electroluminescent display array. The first patterned stress releasing layer covers the first thin film encapsulation layer, and the first patterned stress releasing layer has a predetermined pattern.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present disclosure, features of the embodiments will be made in detail. The embodiments of the present disclosure are illustrated in the accompanying drawings with numbered elements. In addition, the terms such as "first" and "second" described in the present disclosure are used to distinguish different components or processes, which do not limit the sequence of the components or processes.

Figure 1:
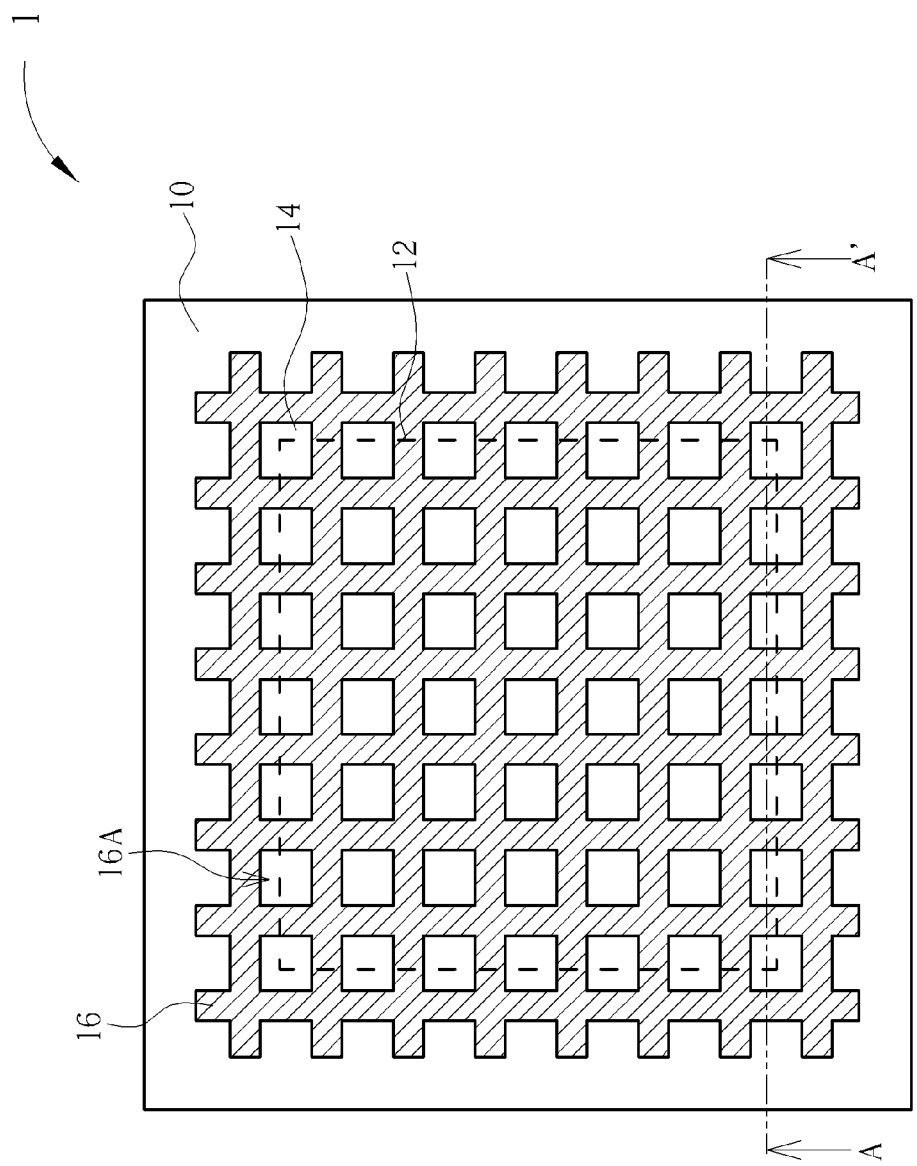
FIG. 1 is a top-view schematic diagram illustrating an electroluminescent display panel according to a first embodiment of the present disclosure.
Figure 2:
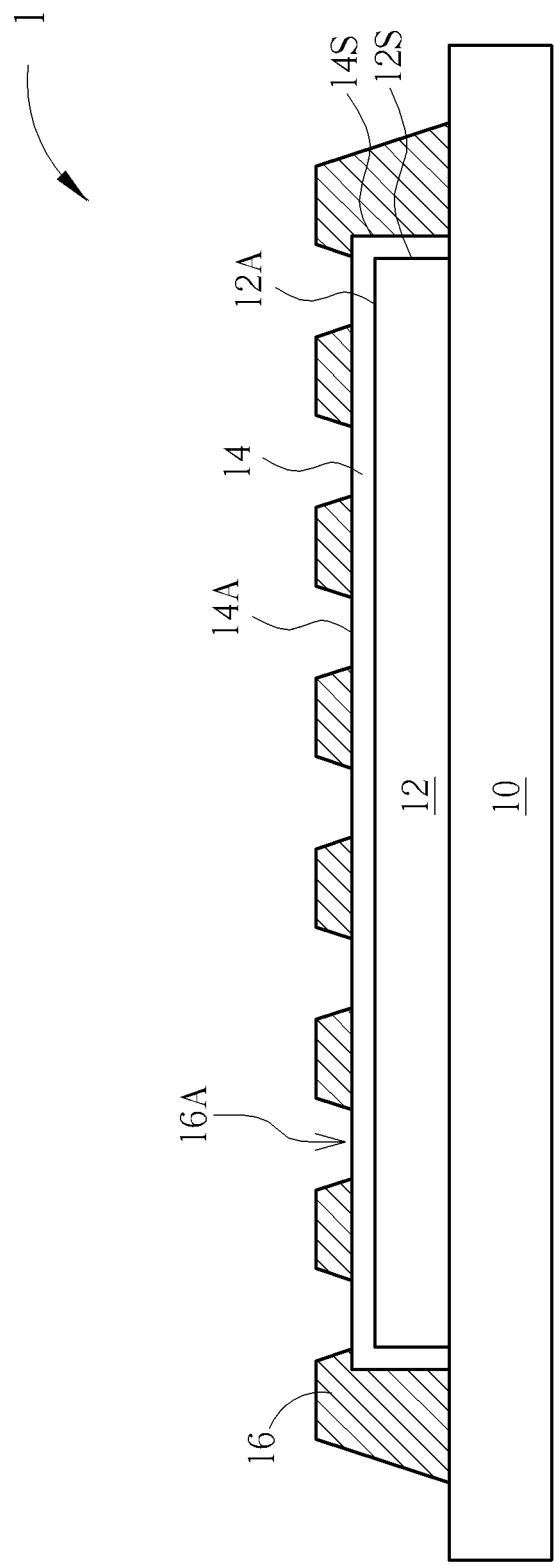
FIG. 2 is a cross-sectional view diagram taken along a cross-sectional line A-A' in FIG. 1.

Please refer to FIGS. 1-2. FIG. 1 is a top-view schematic diagram illustrating an electroluminescent display panel according to a first embodiment of the present disclosure. FIG. 2 is a cross-sectional view diagram taken along a cross-sectional line A-A' in FIG. 1. As shown in FIGS. 1 and 2, the electroluminescent display panel 1 of this embodiment includes a substrate 10, an electroluminescent display array 12, at least one first thin film encapsulation layer 14 and a first patterned stress releasing layer 16. In this embodiment, the substrate 10 may be a flexible substrate, such as a plastic substrate, but not limited thereto. In another variant embodiment, the substrate 10 may be a hard substrate, for example, a glass substrate. The electroluminescent display array 12 is disposed on the substrate 10. The electroluminescent display array 12 includes a plurality of electroluminescent devices, such as organic light-emitting diode (OLED) devices, arranged in an array. The electroluminescent devices may include electroluminescent devices for displaying images of different colors, for example, red electroluminescent devices, green electroluminescent devices and blue electroluminescent devices, but not limited thereto. The electroluminescent devices are respectively disposed in the corresponding sub-pixels. Each of the sub-pixels may further comprise a gate line, a data line, a power line, an active switching device, a driving device, a storage capacitor and other required devices. Since the function and the arrangement of the above-mentioned devices for the sub-pixels are well known to those skilled in the art, they are not redundantly described.

The first thin film encapsulation layer 14 covers the upper surface 12A of the electroluminescent display array 12 and further covers sidewalls 12S of the electroluminescent display array 12 so as to protect the electroluminescent display array 12, block moisture and oxygen, and avoid damage to the electroluminescent devices. The first thin film encapsulation layer 14 may be a single-layered or multiple-layered thin film encapsulation. For example, the first thin film encapsulation layer 14 may include an inorganic thin film encapsulation layer, an organic thin film encapsulation layer, an inorganic/organic hybrid thin film encapsulation layer or a multiple-layered structure of the preceding thin film encapsulation layers. The material of organic thin film encapsulation layer may be, for example, acrylic or epoxy resin. The material of the inorganic thin film encapsulation layer may be, for example, silicon oxide, silicon nitride or silicon oxynitride. Generally, the moisture and oxygen barrier property of the inorganic thin film encapsulation layer is superior to that of the organic thin film encapsulation layer. The stress of the inorganic thin film encapsulation layer, however, is directly proportional to its thickness. And too much stress will destroy inorganic thin film encapsulation layer and make it cracked or peeled. As a result, whether the inorganic thin film encapsulation layer, the organic thin film encapsulation layer or the inorganic/organic hybrid thin film encapsulation layer is applied depends on the desired thickness of the first thin film encapsulation layer 14 and the required moisture and oxygen barrier property.

The first patterned stress releasing layer 16 covers the upper surface 14A of the first thin film encapsulation layer 14 and further covers the sidewalls 14S of the first thin film encapsulation layer 14. In this embodiment, the first patterned stress releasing layer 16 includes a mesh stress releasing layer. The first patterned stress releasing layer 16 has a plurality of first enclosed openings 16A for partially exposing the upper surface 14A of the first thin film encapsulation layer 14. The first patterned stress releasing layer 16 provides at least three functions as follows. First, the first patterned stress releasing layer 16 can release stress, thereby preventing the first thin film encapsulation layer 14 from cracking or peeling off due to the stress is too large. Second, the first patterned stress releasing layer 16 eliminates optical interference when light emitted by the electroluminescent display array 12 passes through the multi-layered thin film encapsulation layers of different refractive index, thereby improving the optical quality of the electroluminescent display panel 1. Third, the first patterned stress releasing layer 16 enhances light extraction efficiency. The first enclosed openings 16A in this embodiment are rectangular openings; however, the shape is not limited to this and may be other regular shapes, such as a polygon or a circle, or irregular shapes. Moreover, the first enclosed openings 16A of the first patterned stress releasing layer 16 may be arranged periodically or in an array, but not limited thereto. In a variant embodiment, the first enclosed openings 16A of the first patterned stress releasing layer 16 are arranged non-periodically. The material of the first patterned stress releasing layer 16 may be inorganic materials or organic materials. Organic materials may include, for example but not limited to, acrylic-based polymers, parylene or polyurea, but not limited thereto. The first patterned stress releasing layer 16 may be formed by performing a vacuum deposition process, a printing process (such as an ink-jet printing process or a screen printing process), a transfer printing (such as a thermal transfer printing) or other suitable processes. The material, the size and the arrangement of the first enclosed openings 16A and both the material and the thickness of the first patterned stress releasing layer 16 may be modified and determined according to the above-mentioned three functions.

Electroluminescent display panels are not restricted to the preceding embodiments in the present disclosure. Other embodiments or modifications will be detailed in the following description. In order to simplify and show the differences or modifications between the following embodiments and the above-mentioned embodiment, the same numerals denote the same components in the following description, and the similar parts are not detailed redundantly.

Figure 3:
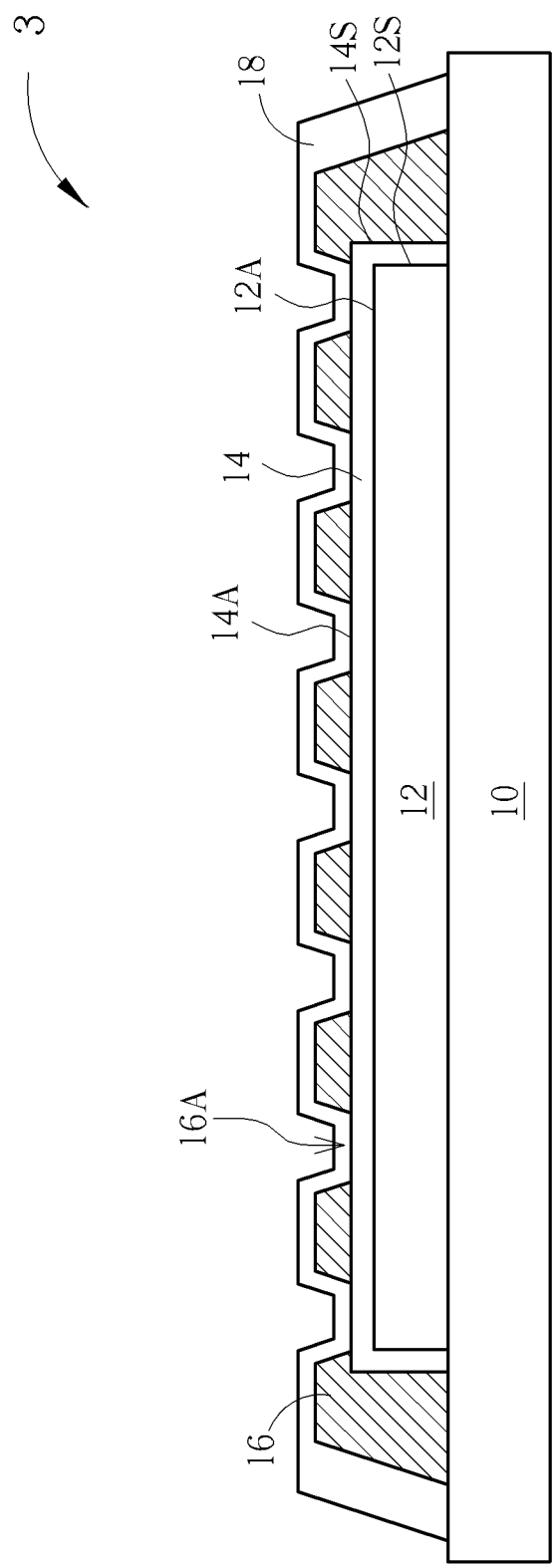
FIG. 3 is a schematic diagram illustrating an electroluminescent display panel according to a second embodiment of the present disclosure.

Please refer to FIG. 3. FIG. 3 is a schematic diagram illustrating an electroluminescent display panel according to a second embodiment of the present disclosure. As shown in FIG. 3, compared with the first embodiment, in the electroluminescent display panel 3 of this embodiment further includes at least one second thin film encapsulation layer 18. The second thin film encapsulation layer 18 covers the first patterned stress releasing layer 16 and further cover the sidewalls of the first patterned stress releasing layer 16 so as to improve the moisture and oxygen barrier property. The second thin film encapsulation layer 18 may be a single-layered or multiple-layered thin film encapsulation. For example, the second thin film encapsulation layer 18 may include an inorganic thin film encapsulation layer, an organic thin film encapsulation layer, an inorganic/organic hybrid thin film encapsulation layer or a multiple-layered structure of the preceding thin film encapsulation layers. The material of organic thin film encapsulation layer may be, for example, acrylic or epoxy resin. The material of inorganic thin film encapsulation layer may be, for example, silicon oxide, silicon nitride, or silicon oxynitride. Generally, the moisture and oxygen barrier property of the inorganic thin film encapsulation layer is superior to that of the inorganic thin film encapsulation layer. The stress of inorganic thin film encapsulation layer, however, is directly proportional to its thickness. And too much stress will destroy inorganic thin film encapsulation layer and make it cracked or peeled. As a result, whether the inorganic thin film encapsulation layer, the organic thin film encapsulation layer or the inorganic/organic hybrid thin film encapsulation layer is applied depends on the desired thickness of the second thin film encapsulation layer 18 and the required moisture and oxygen barrier property.

Figure 4:
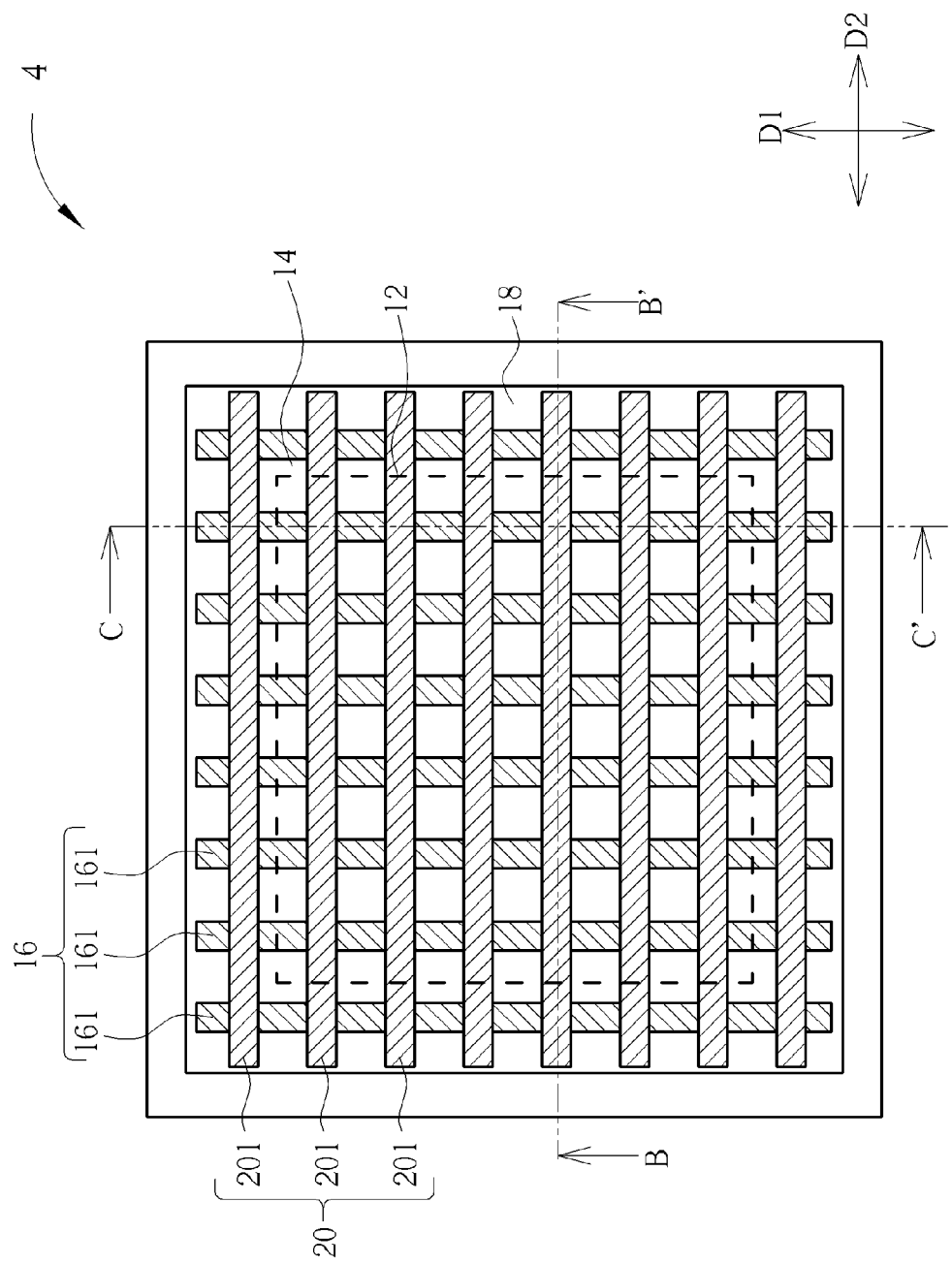
FIG. 4 is a top-view schematic diagram illustrating an electroluminescent display panel according to a third embodiment of the present disclosure.
Figure 5:
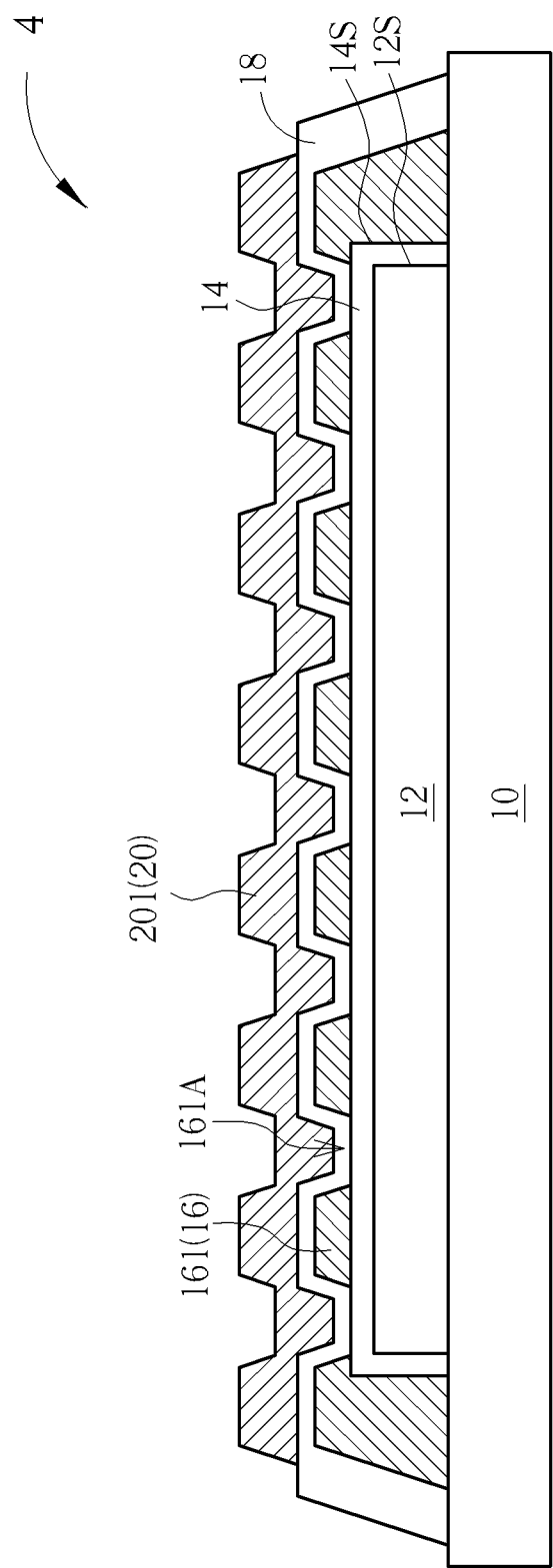
FIG. 5 is a cross-sectional view diagram taken along a cross-sectional line B-B' in FIG. 4.
Figure 6:
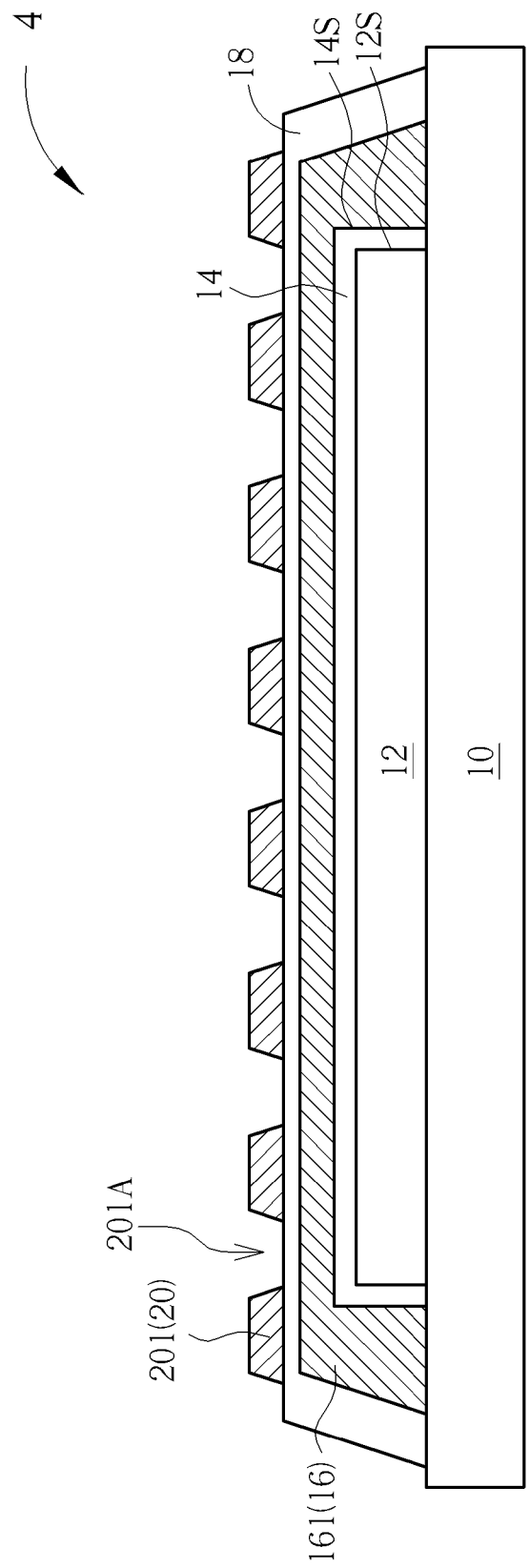
FIG. 6 is a cross-sectional view diagram taken along a cross-sectional line C-C' in FIG. 4.

Please refer to FIGS. 4-6. FIG. 4 is a top-view schematic diagram illustrating an electroluminescent display panel according to a third embodiment of the present disclosure. FIG. 5 is a cross-sectional view diagram taken along a cross-sectional line B-B' in FIG. 4. FIG. 6 is a cross-sectional view diagram taken along a cross-sectional line C-C' in FIG. 4. As shown in FIGS. 4-6, compared with the second embodiment, the electroluminescent display panel 4 of this embodiment further includes a second patterned stress releasing layer 20. The second patterned stress releasing layer 20 covers the second thin film encapsulation layer 18. The second patterned stress releasing layer 20 can also release stress, eliminate optical interference and enhance light extraction efficiency. Furthermore, the material of the second patterned stress releasing layer 20 may be inorganic materials or organic materials, and the material may be the same as or different from that of the first patterned stress releasing layer 16. In this embodiment, the first patterned stress releasing layer 16 comprises a plurality of first stripe structures 161 arranged along a first direction D1. A first opening 161A is formed between any two adjacent first stripe structures 161 (as shown in FIG. 5), and the first opening 161A partially exposes the first thin film encapsulation layer 14. The second patterned stress releasing layer 20 comprises a plurality of second stripe structures 201 arranged along a second direction D2. A second opening 201A is formed between any two adjacent second stripe structures 201 (as shown in FIG. 6), and the second opening 201A partially exposes the second thin film encapsulation layer 18. In this embodiment, the electroluminescent display panel 4 includes two thin film encapsulation layers and two patterned stress releasing layers so that it can perfectly release stress, eliminate optical interference, enhance light extraction efficiency and it possess high moisture and oxygen barrier property. In this embodiment, the first direction D1 is substantially perpendicular to the second direction D2. The first stripe structures 161 intersect and thus partially overlap the second stripe structures 201.

Figure 7:
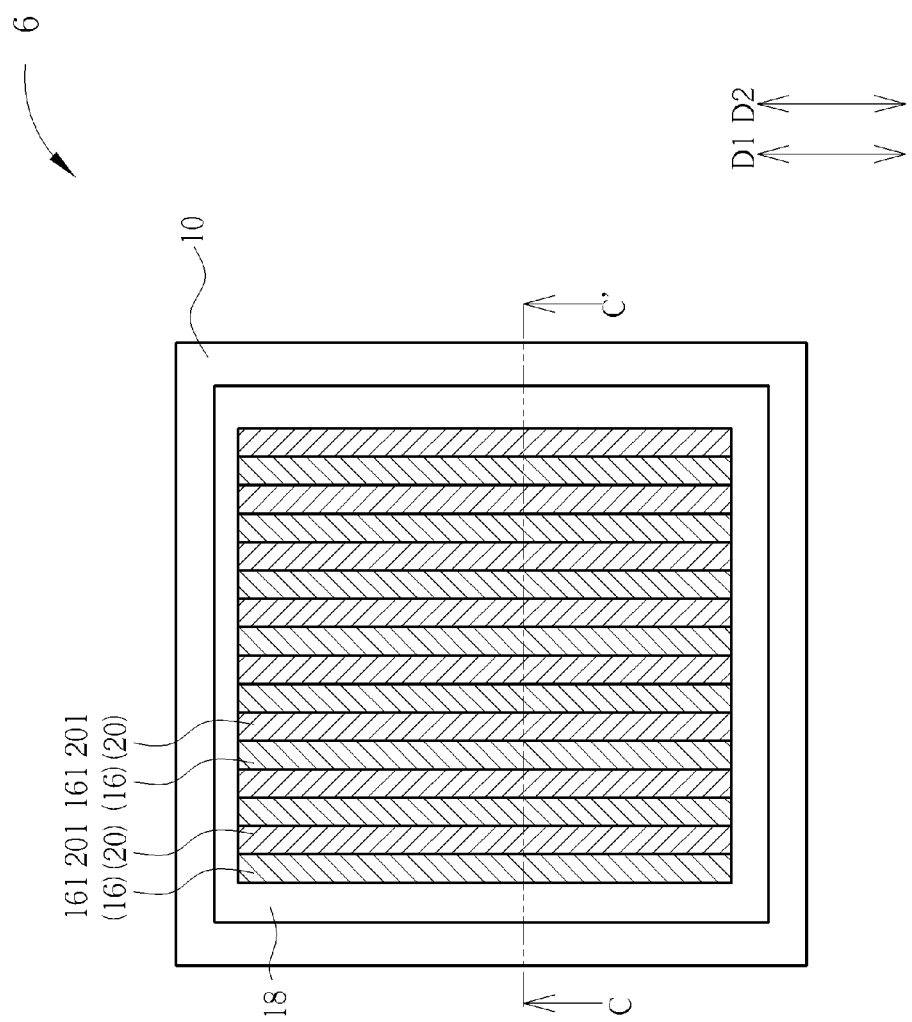
FIG. 7 is a top-view schematic diagram illustrating an electroluminescent display panel according to a fourth embodiment of the present disclosure.
Figure 8:
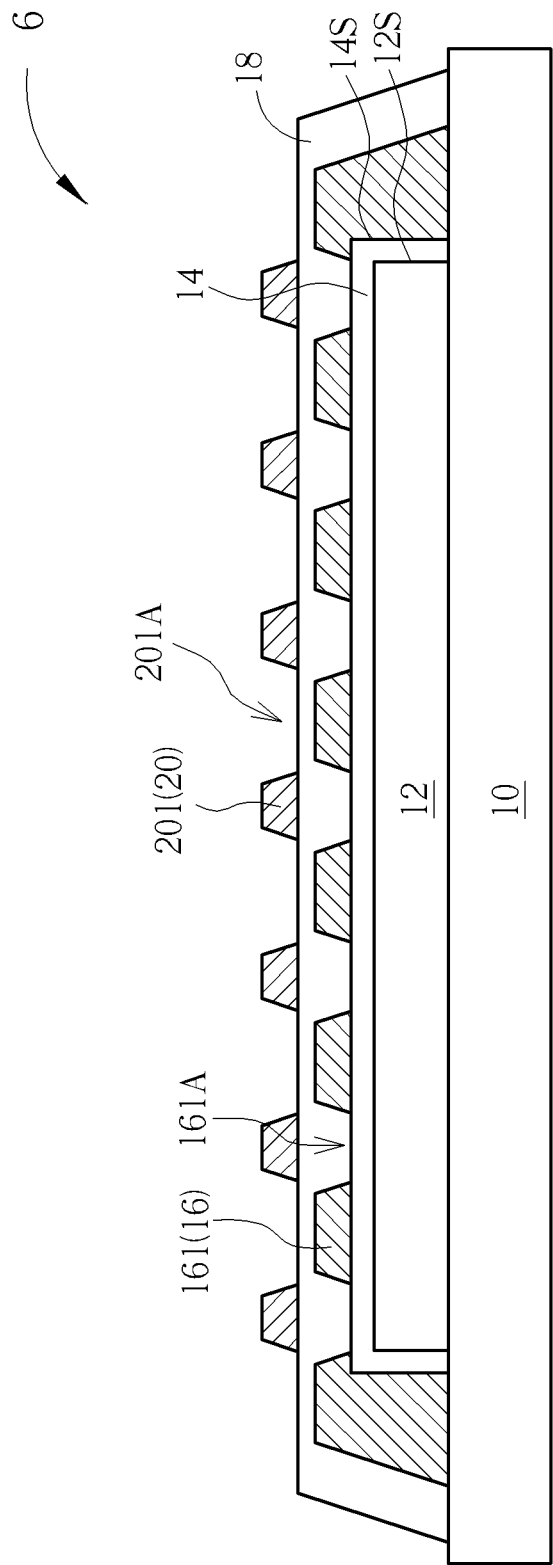
FIG. 8 is a cross-sectional view diagram taken along a cross-sectional line C-C' in FIG. 7.

Please refer to FIGS. 7-8. FIG. 7 is a top-view schematic diagram illustrating an electroluminescent display panel according to a fourth embodiment of the present disclosure. FIG. 8 is a cross-sectional view diagram taken along a cross-sectional line C-C' in FIG. 7. As shown in FIGS. 7-8, compared with the third embodiment, in the electroluminescent display panel 6, the first direction D1 is substantially parallel to the second direction D2. Additionally, the first stripe structures 161 and the second stripe structures 201 are alternately arranged in a vertical projection direction on the substrate. The first stripe structures 161 substantially correspond to the second openings 201A. The second stripe structures 201 substantially correspond to the first openings 161A. In other words, the pattern of the first patterned stress releasing layer 16 and the pattern of the second patterned stress releasing layer 20 are arranged complementarily so that there is no overlap in the vertical projection direction. The electroluminescent display panel 6 in this embodiment also includes two thin film encapsulation layers and two patterned stress releasing layers so that it can perfectly release stress, eliminate optical interference, enhance light extraction efficiency and it possess high moisture and oxygen barrier property.

To sum up, the patterned stress releasing layers of the electroluminescent display panel of the present disclosure not only effectively avoid damage to thin film encapsulations layer, eliminate optical interference and enhance light extraction efficiency but further improve optical performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electroluminescent display panel, comprising:
   a substrate;
   an electroluminescent display array, disposed on the substrate;
   at least one first thin film encapsulation layer, covering the electroluminescent display array; and
   a first patterned stress releasing layer, covering the at least one first thin film encapsulation layer, and the first patterned stress releasing layer having a predetermined pattern, wherein the first patterned stress releasing layer is in contact with the at least one first thin film encapsulation layer.

2. The electroluminescent display panel according to claim 1, wherein the first patterned stress releasing layer comprises a mesh stress releasing layer, and the first patterned stress releasing layer has a plurality of first enclosed openings partially exposing the at least one first thin film encapsulation layer.

3. The electroluminescent display panel according to claim 2, wherein the first enclosed openings of the first patterned stress releasing layer are arranged periodically.

4. The electroluminescent display panel according to claim 2, wherein the first enclosed openings of the first patterned stress releasing layer are arranged non-periodically.

5. The electroluminescent display panel according to claim 1, wherein the at least one first thin film encapsulation layer further covers sidewalls of the electroluminescent display array, and the first patterned stress releasing layer further covers sidewalls of the at least one first thin film encapsulation layer.

6. The electroluminescent display panel according to claim 1, further comprising at least one second thin film encapsulation layer covering the first patterned stress releasing layer.

7. The electroluminescent display panel according to claim 6, wherein the at least one second thin film encapsulation layer comprises at least one of an inorganic thin film encapsulation layer, an organic thin film encapsulation layer and an inorganic/organic hybrid thin film encapsulation layer.

8. The electroluminescent display panel according to claim 7, further comprising a second patterned stress releasing layer covering the at least one second thin film encapsulation layer, and the second patterned stress releasing layer having another predetermined pattern.

9. The electroluminescent display panel according to claim 8, wherein the first patterned stress releasing layer comprises a plurality of first stripe structures arranged along a first direction, a first opening is formed between any two adjacent first stripe structures for partially exposing the at least one first thin film encapsulation layer, the second patterned stress releasing layer comprises a plurality of second stripe structures arranged along a second direction, a second opening is formed between any two adjacent second stripe structures for partially exposing the at least one second thin film encapsulation layer.

10. The electroluminescent display panel according to claim 9, wherein the first direction is substantially perpendicular to the second direction.

11. The electroluminescent display panel according to claim 9, wherein the first direction is substantially parallel to the second direction, the first stripe structures and the second stripe structures are alternately arranged in a vertical projection direction, the first stripe structures substantially correspond to the second openings, and the second stripe structures substantially correspond to the first openings.

12. The electroluminescent display panel according to claim 1, wherein the substrate comprises a flexible substrate.

* * * * *